US007714589B2

(12) United States Patent
Jun et al.

(10) Patent No.: US 7,714,589 B2
(45) Date of Patent: May 11, 2010

(54) ARRAY TEST USING THE SHORTING BAR AND HIGH FREQUENCY CLOCK SIGNAL FOR THE INSPECTION OF TFT-LCD WITH INTEGRATED DRIVER IC

(75) Inventors: Mike Jun, San Jose, CA (US); Atila Ersahin, Fremont, CA (US); Barry McGinley, San Jose, CA (US); Sabari Sanjeevi, San Jose, CA (US)

(73) Assignee: Photon Dynamics, Inc., San Jose, CA (US)

( * ) Notice: Subject to any disclaimer, the term of this patent is extended or adjusted under 35 U.S.C. 154(b) by 0 days.

(21) Appl. No.: 11/559,577

(22) Filed: Nov. 14, 2006

(65) Prior Publication Data

US 2007/0109011 A1 May 17, 2007

Related U.S. Application Data

(60) Provisional application No. 60/737,090, filed on Nov. 15, 2005.

(51) Int. Cl.
*G01R 31/08* (2006.01)
*G01R 31/00* (2006.01)

(52) U.S. Cl. ...................................... 324/527; 324/770

(58) Field of Classification Search ................. 324/527, 324/770; 382/149; 349/139
See application file for complete search history.

(56) References Cited

U.S. PATENT DOCUMENTS

| | | | | |
|---|---|---|---|---|
| 4,983,911 | A | 1/1991 | Henley | |
| 5,081,687 | A | 1/1992 | Henley et al. | |
| 5,465,052 | A * | 11/1995 | Henley | 324/770 |
| 5,852,480 | A * | 12/1998 | Yajima et al. | 349/40 |
| 5,999,012 | A * | 12/1999 | Listwan | 324/770 |
| 6,392,719 | B2 * | 5/2002 | Kim | 349/40 |
| 6,781,403 | B2 * | 8/2004 | Kim | 324/770 |
| 6,801,265 | B2 * | 10/2004 | Choi et al. | 349/40 |
| 7,038,484 | B2 * | 5/2006 | Harada et al. | 324/770 |
| 2004/0222816 | A1 * | 11/2004 | Bae et al. | 324/770 |
| 2007/0046316 | A1 * | 3/2007 | Uei et al. | 324/770 |

OTHER PUBLICATIONS

Kim et al, "High-Resolution Integrated a-Si Row Driver Circuits," *SID 05 Digest*, vol. 36, Issue 1, pp. 939-941.
Lebrun et al "Design of Integrated Drivers with Amorphous Silicon TFTs for Small Displays, Basic Concepts" *SID 05 Digest*, vol. 36, Issue 1, pp. 950-953.

* cited by examiner

*Primary Examiner*—Jeff Natalini
(74) *Attorney, Agent, or Firm*—Townsend and Townsend and Crew LLP

(57) ABSTRACT

In accordance with the present invention, a first shorting bar drives the data lines of a TFT array having integrated gate driver circuitry. Another set of shorting bars drive the corresponding terminals of the gate driver circuitry. The pixel voltages are measured after all the pixels are charged by the driving signals applied to the shorting bars. Gate voltages are progressively applied to the gate lines by the gate driver integrated circuit (IC) via the set of shorting bars that, in turn, are driven by clock signals received from one or more pattern generators. Voltages are concurrently applied to the data lines which are connected together by the first shorting bar. The application of voltages generates a display pattern that is subsequently compared to an expected display pattern. By comparing the resulting display pattern and the expected display pattern, possible defects are detected.

6 Claims, 4 Drawing Sheets

| Pin No. | Symbol | Description |
|---|---|---|
| 1 | Reset | Gate driver reset pulse input |
| 2 | CLK1 | Gate driver clock input |
| 3 | CLK2 | Gate driver clock input |
| 4 | CLK3 | Gate driver clock input |
| 5 | CLK4 | Gate driver clock input |
| 6 | Vdd | Gate driver power supply voltage |
| 7 | Vdd1 | Gate driver power supply voltage |
| 8 | Vdd2 | Gate driver power supply voltage |
| 9 | Vgl | Gaate driver low voltage |
| 10 | Vst | Gate driver start pulse input |
*FIG. 7A*
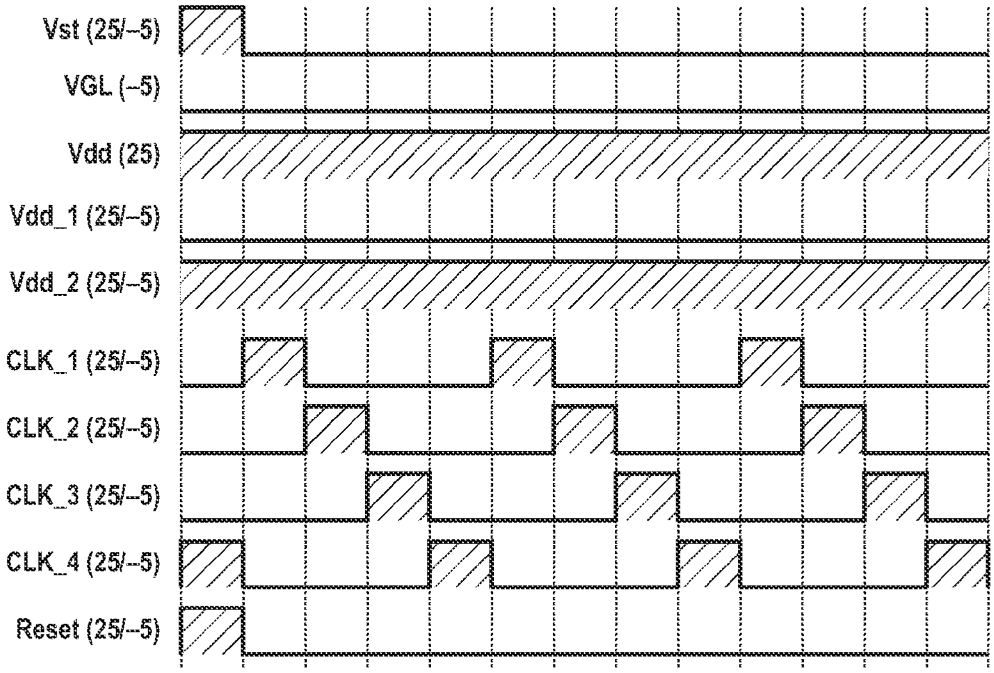
*FIG. 7B*
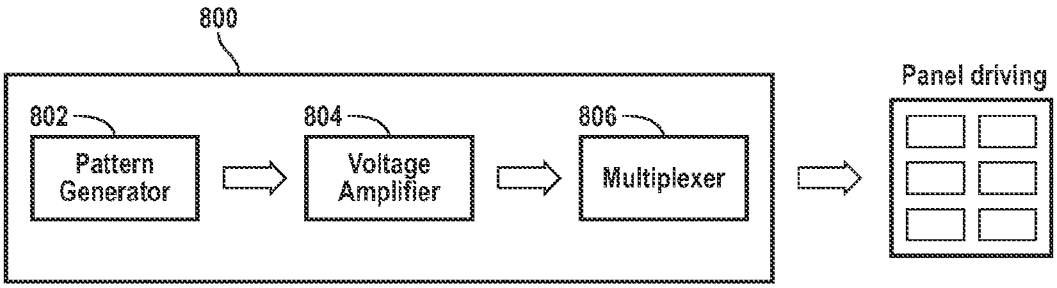
*FIG. 8*

ARRAY TEST USING THE SHORTING BAR AND HIGH FREQUENCY CLOCK SIGNAL FOR THE INSPECTION OF TFT-LCD WITH INTEGRATED DRIVER IC

CROSS REFERENCE TO RELATED APPLICATIONS

The present application is related to and claims benefit under 35 USC 119(e) of U.S. provisional Application No. 60/737,090, filed Nov. 15, 2005, entitled "Array Test Using The Shorting Bar And High Frequency Clock Signal For The Inspection Of TFT-LCD With Integrated Driver IC", the content of which is incorporated herein by reference in its entirety.

BACKGROUND OF THE INVENTION

The present invention relates generally to inspection of thin film transistor (TFT) arrays, and more specifically to inspection of TFT arrays that have integrated circuit (IC) drivers.

In a finished liquid crystal flat panel, a thin layer of liquid crystal (LC) material is disposed between two sheets of glass. On one sheet of glass, a two-dimensional array of electrodes has been patterned. Each electrode may be on the order of 100 microns in size and can have a unique voltage applied to it via multiplexing transistors positioned along the edge of the panel. In a finished product, the electric field created by each individual electrode couples into the LC material and modulates the amount of transmitted light in that pixelated region. This effect when taken in aggregate across the entire two dimensional array results in a visible image on the flat-panel.

A significant part of the manufacturing cost associated with LCD panels occurs when the LC material is injected between the upper and lower glass plates. It is therefore important to identify and correct any image quality problems prior to this manufacturing step. The problem with inspecting LCD panels prior to deposition of the liquid crystal (LC) material is that without LC material, there is no visible image available to inspect. Prior to deposition of LC material, the only signal present at a given pixel is the electric field generated by the voltage on that pixel, if driven by an external electrical source. Means of testing such panel arrays typically take advantage of an electrical property of the pixel (such as electrical field or pixel voltage as a function of changing drive voltages on the transistor gates or data lines). Array testers devised by Photon Dynamics use a voltage image optical system (VIOS), as described by U.S. Pat. No. 4,983,911, for example. Array testers sold by Applied Komatsu use an electron beam and imaging system to detect defects. Both these array test machines require a means to electrically drive the sample in conjunction with their respective detection methodologies.

U.S. Pat. No. 5,081,687, issued to Henley et al. and incorporated herein by reference in its entirety, describes an array test method according to which a pattern of electrical driving signals are applied to the panel under test. Referring to FIG. 1, a typical active matrix LCD panel segment 10 is shown as including, an array of pixels 12. Each pixel 12 is activated by addressing simultaneously an appropriate drive line 14 and gate line 16. A drive element 18 is associated with each pixel. The drive lines 14, gate lines 16, pixels 12 and pixel drive elements 18 are deposited on a clear glass substrate by a lithographic or other processes. Odd numbered gate lines may be addressed simultaneously via shorting bar 30, which joins every other gate line 16. Even numbered gate lines may be addressed by a second shorting bar (not shown). Similarly, odd numbered data lines may be addressed via shorting bar 28, which joins every other data line 14. Even numbered data lines may be addressed by a second shorting bar (not shown). Different drive patterns may be applied to the gate and data lines to determine which pixels may be defective.

Typically, electrical drive circuitry of the final display panel is added during manufacturing and assembly of the panel into its final form (for example, computer monitor, cell phone display, television, etc.) FIG. 2 shows a panel 200 that is in electrical communication with printed circuit board 204 using a multitude of connectors 204. Panel 200 of FIG. 2 is assumed to include the circuitry shown in FIG. 1. A gate driver integrated circuit (IC) (not shown) is mounted on printed circuit board 204 which is then brought into electrical contact with panel 200 for driving the pixel gate lines.

Recently, however, with the increased application of amorphous silicon material and associated processes and designs, integrated circuit (IC) gate drivers are being formed on the panel, as shown in simplified FIG. 3. See for example Kim et al, "High-Resolution Integrated a-Si Row Drivers," *SID* 05 *Digest*, page 939; Lebrun et al "Design of Integrated Drivers with Amorphous Silicon TFTs for Small Displays, Basic Concepts" *SID* 05 *Digest*, page 950.

SUMMARY OF THE INVENTION

In accordance with the present invention, a first shorting bar drives the data lines of a TFT array having integrated gate driver circuitry. Another set of shorting bars drive the corresponding terminals of the gate driver circuitry. The pixel voltages are measured after all the pixels are charged by the driving signals applied to the shorting bars. Gate voltages are progressively applied to the gate lines by the gate driver integrated circuit (IC) via the set of shorting bars that, in turn, are driven by clock signals received from one or more pattern generators. Voltages are concurrently applied to the data lines which are connected together by the first shorting bar. The application of voltages generates a display pattern that is subsequently compared to an expected display pattern. By comparing the resulting display pattern and the expected display pattern, possible defects are detected.

DESCRIPTION OF THE DRAWINGS

FIG. 7A is a table showing the number of input signals of another exemplary gate driver IC.

FIG. 7B is an exemplary timing diagram of the input signals shown in FIG. 5A.

FIG. 8 shows a number of exemplary circuit blocks used in generating signals that drive shorting bars of the present invention.

DETAILED DESCRIPTION OF THE INVENTION

In accordance with the present invention, a first shorting bar drives the data lines of a TFT array having integrated gate driver circuitry, i.e., a TFT array having a substrate on which the integrated circuit is formed. Another set of shorting bars drive the corresponding terminals of the gate driver circuitry. The pixel voltages are measured after the pixels are charged by the driving signals. Gate voltages are progressively applied to the gate lines by the gate driver IC via the set of shorting bars that, in turn, are driven by clock signals received from one or more pattern generators. Voltages are concurrently applied to the data lines which are connected together by the first shorting bar. The current invention generates arbitrary waveform with high frequency for the gate driver IC and with low frequency for the data lines. In some embodiments, a first multitude of shorting bars may be used to supply signals to the data lines and a second multitude of shorting bars may be used to supply signals to the gate lines.

Figure 1:
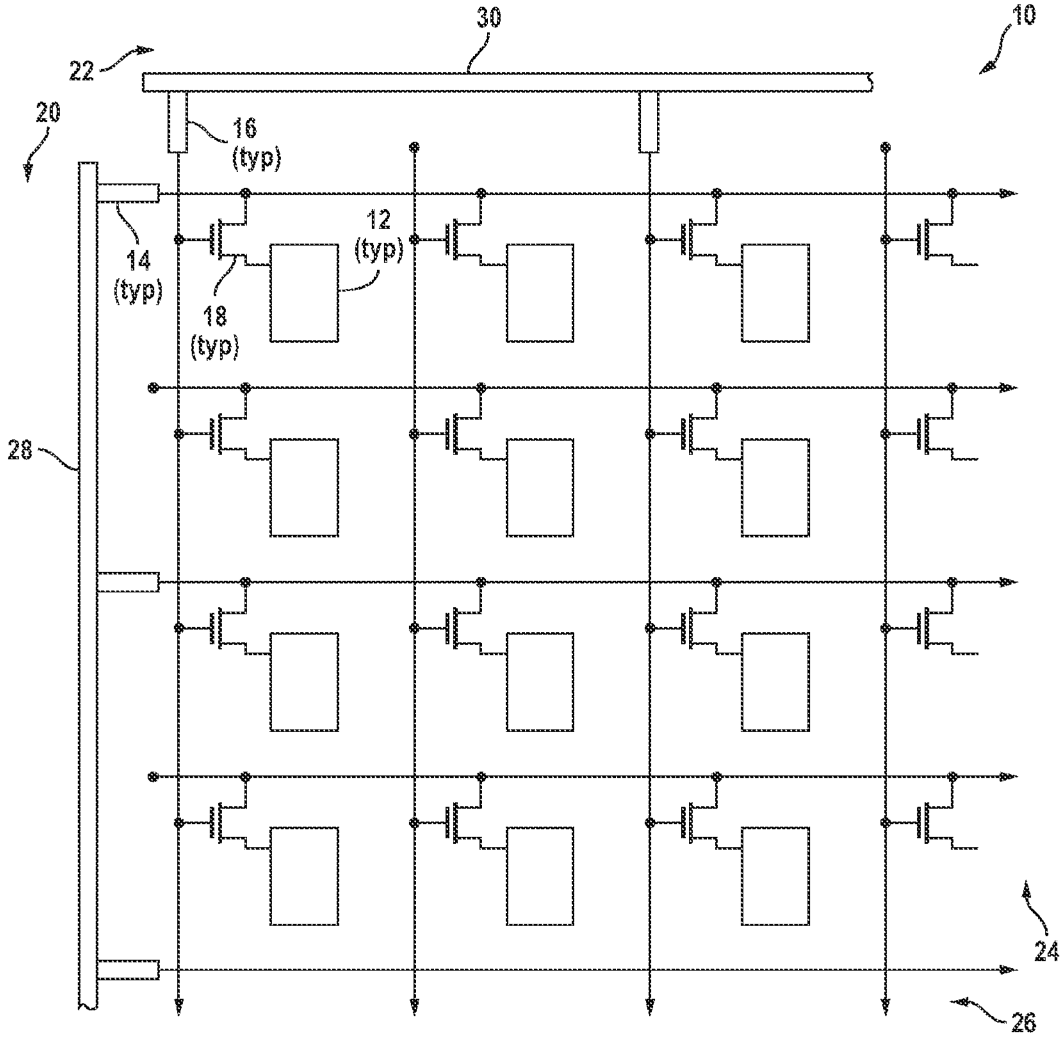
FIG. 1 shows a typical active matrix LCD panel segment, as known in the prior art.
Figure 2:
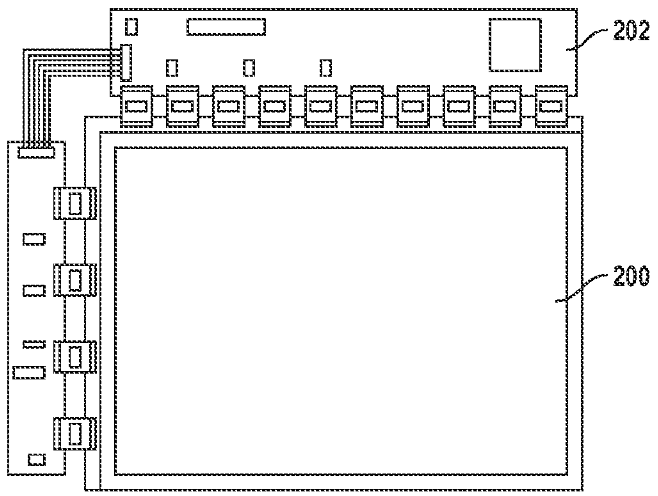
FIG. 2 shows a partially assembled panel in electrical contact with a printed circuit board that includes an integrated circuit gate driver, as known in the prior art.
Figure 3:
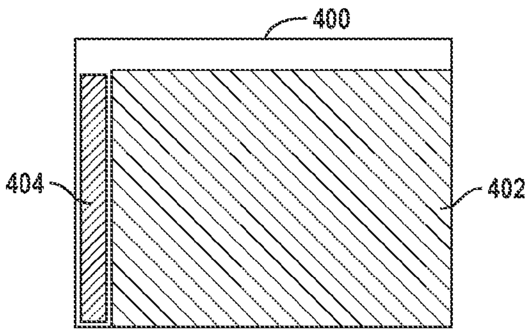
FIG. 3 shows a partially assembled panel with an integrated circuit adapted to drive the gate lines of the pixels formed on the panel.
Figure 4A:
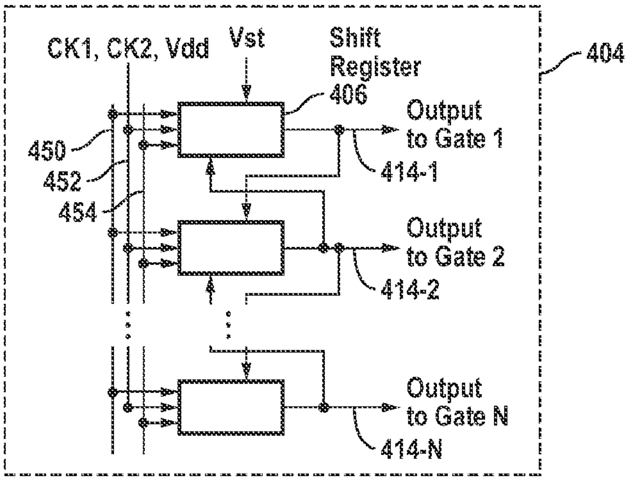
FIG. 4A shows a multitude of shift registers disposed in a gate driver IC integrated onto the TFT panel.
Figure 4B:
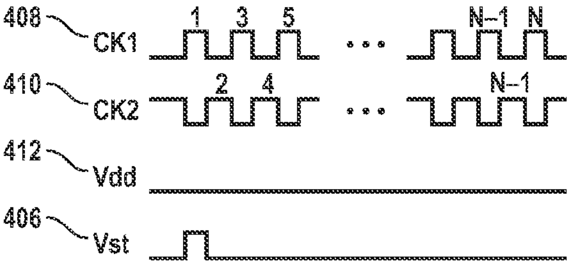
FIG. 4B is a timing diagram of a number of input signals applied to the gate driver circuit of FIG. 4A.
Figure 4C:
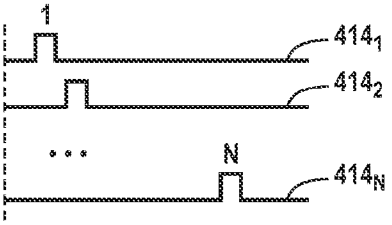
FIG. 4C is a timing diagram of a number of the output signals generated by the gate driver circuit of FIG. 4A.

FIG. 4A illustrates a gate driver IC 404 shown as including a multitude of shift registers $\mathbf{406}_1 \ldots \mathbf{406}_N$ (collectively and alternatively referred to herein as 406) each receiving a pair of clock signals that are 180 out-of-phase, and an enabling signal Vst. Each register 406 is configured to output a pulse when its associated enable signal Vst is asserted. FIG. 4B is a timing diagram of the signals applied to the gate driver IC 404, and FIG. 4C is a timing diagram of the signals generated by gate driver IC 404. As seen from these timing diagrams, when signal Vst applied to an input terminal of shift register $\mathbf{406}_1$ makes a low-to-high transition, shift register 406 generates an output pulse, synchronously with respect to the clock signal CK1 and CK2, that is shown as being supplied to gate $414_1$ (not shown). In other words, signal Vst enables the start of the driving pattern. The output pulse of shift register $\mathbf{406}_1$ is used as an enabling signal to shift register $\mathbf{406}_2$, which, in turn, supplies its output signal to gate $\mathbf{414}_2$ (not shown), etc. Accordingly, output pulses 414 are generated in a stepwise fashion in time, corresponding to the stream of input clock signal CK1 and CK2. In accordance with the present invention, a first shorting bar 450 is used to supply clock signal CK1 to shift registers 406, a second shorting bar 452 is used to supply clock signal CK2 to shift registers 406, and a third shorting bar 454 is used to supply voltage Vdd. The two-phase clock design, i.e., a pair of complementary clock signals that are 180° out-of-phase, allows any signal distortions from clock feed-through and high parasitic capacitances to be compensated by the opposing clock.

To electrically test a TFT array, a pattern of electric driving signals is applied and a means of detection, such as Photon Dynamics' voltage imaging system, (VIOS) scans over the panel observing optically or electrically any pixels that are not responding to the pattern of signals. The pattern of electric driving signals is applied to the IC gate drivers as described above, and also to the data lines through the data shorting bars or individual data lines. The generated display pattern is compared to an expected display pattern to detect defects.

Figure 5:
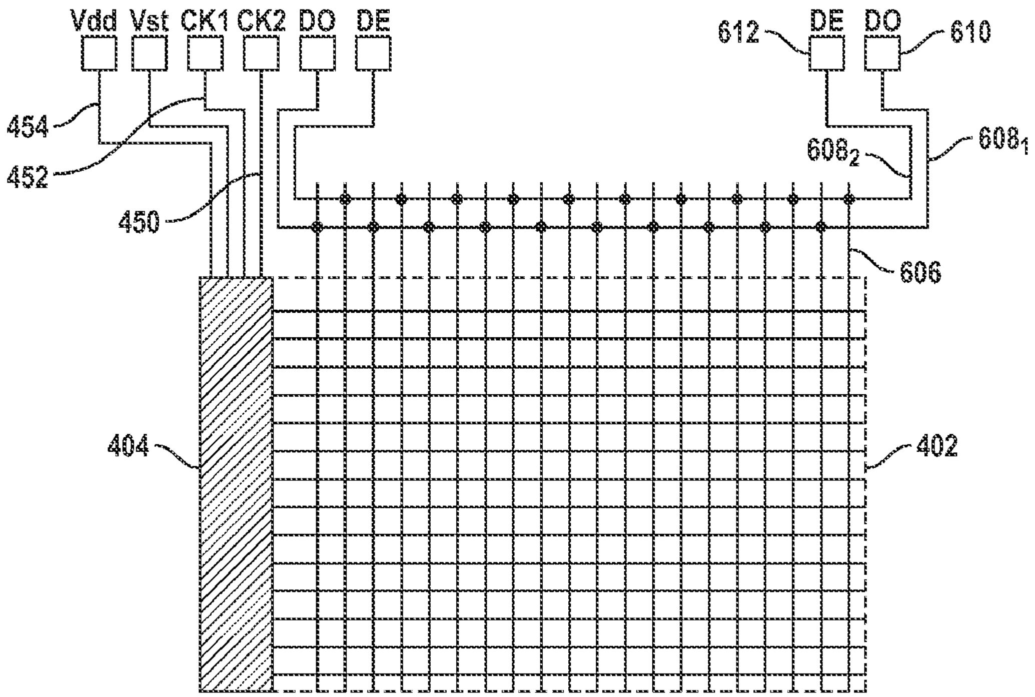
FIG. 5 is a simplified high level block diagram of a flat panel being tested using a multitude of shorting bars, in accordance with one embodiment of the present invention.

FIG. 5 is a highly simplified top level view of panel 400. As shown, panel 400 includes, in part, pixel array 402, and gate driver IC 404. Gate driver IC 404 includes a multitude of shift registers as shown in FIG. 4A. In the example of FIG. 5, IC gate driver 404 requires three input signals, namely signals Vst, CLK1, CLK2, and a supply voltage VDD. Signals CLK1 and CLK2 are respectively driven by shorting bars 450 and 452. Voltage Vdd is supplied using shorting bar 454.

Figure 6:
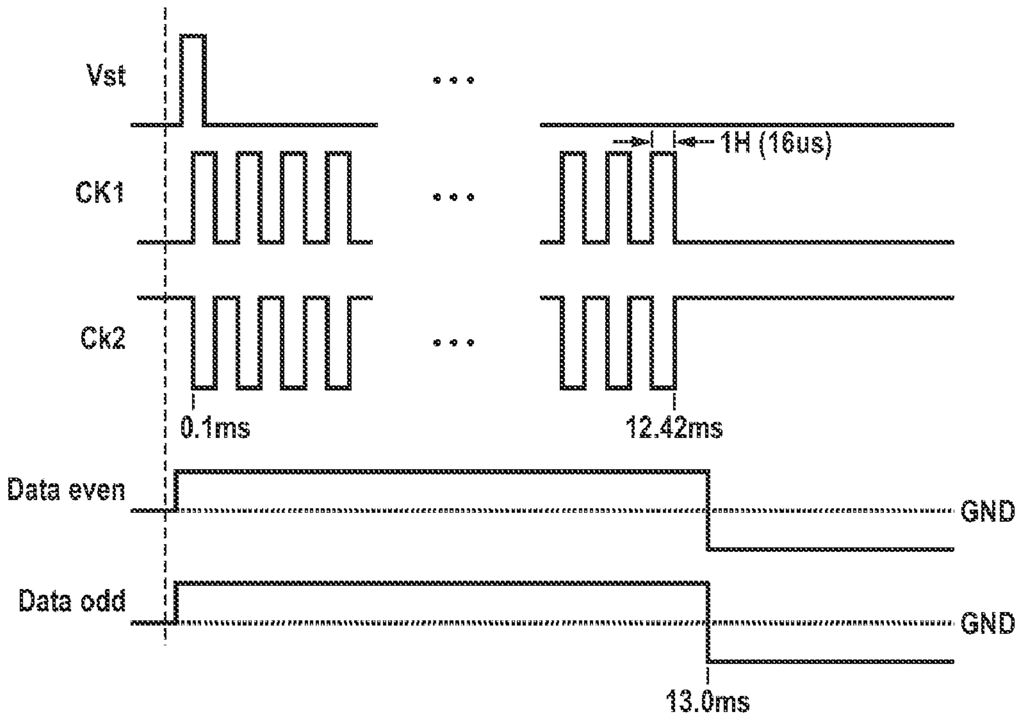
FIG. 6 is an exemplary timing diagram of the various signals used in testing of the flat panel of FIG. 5.

The data lines are driven through shorting bars $\mathbf{608}_1$ and $\mathbf{608}_2$. The data lines are separated into a set of "odd" lines and "even" lines, which are connected respectively via shorting bars $\mathbf{608}_1$ and $\mathbf{608}_2$ to contact pads DO ("data odd") 610 and DE ("data even") 612. In accordance with the test method of the present invention, pixels which are connected together with the same shorting bar are turned on concurrently. FIG. 6 is an exemplary timing diagram of the various signals shown in FIG. 5. As shown in FIG. 6, the data lines ("Data even" and "Data odd") are typically driven at a lower frequency relative to the gate lines ("CK1" and "CK2").

Each flat panel manufacturer designs the IC gate drivers differently, and may have different input signal definitions as well as different number of required input signals. FIG. 7A is a table illustrating another example of a gate driver IC (not shown) having ten input terminals and thus requiring ten input signals to operate. FIG. 7B shows an example of a timing diagram of the input signals corresponding to the table shown in FIG. 6A. In accordance with the present invention, 6 shorting bars supplying signals Reset, CLK1, CLK2, CLK3, CLK4, and Vg1, are used with each shorting bar supplying a signal to a different one of the ten input terminals of such a gate driver IC. Three more shorting bars supply drive voltages Vdd, Vdd1 and Vdd2 to the transistors.

One example of the system configuration to test TFT array with an integrated gate driver circuit is shown in FIG. 8. Pattern generator 802 generates arbitrary waveforms and voltage amplifier 804 amplifies the generated waveforms. Multiplexer 806 selects the panel to test and delivers the required signals to the IC gate driver and data line shorting bar. The gate driver IC may be designed to operate at a frequency of 60 Hz or 75 Hz in one embodiment. The typical pulse width of the clock signal with 60 Hz driving for XGA resolution panel is 20 μs. If the design parameter for safety factor is 2, the pulse width should be bigger than 10 μs to drive the gate driver IC. In the example shown in FIG. 6, the clock pulse width is 16 μs which is smaller than the typical pulse width of 60 Hz driving for XGA. However, this can properly turn on the pixels. The present invention may be used to test both types of TFT array, a conventional TFT array and a TFT array with gate driver IC implemented, with the same system.

The above embodiments of the present invention are illustrative and not limiting. Various alternatives and equivalents are possible. The invention is not limited by the type of flat panel display, nor is it limited by the type of gate driver circuit integrated in with the flat panel. The invention is not limited by the number of input signals of the integrated gate driver circuit. Other additions, subtractions or modifications are obvious in view of the present disclosure and are intended to fall within the scope of the appended claims.

What is claimed is:

1. A method for testing a flat panel display comprising an active array matrix substrate, including a driver integrated circuit formed therein; the method comprising:

coupling a first shorting bar to a first plurality of clock input terminals of N successive registers disposed in the driver integrated circuit;

coupling a second shorting bar to a second plurality of clock input terminals of the N successive registers;

applying an enabling signal to an enable/disable terminal of a first register;

coupling an output terminal of the (i-1) register to an enable/disable terminal of the i register, wherein i is an integer varying from 2 to N;

applying a first clock signal to said first shorting bar;

applying a second clock signal to the second shorting bar, said second clock signal having 180 degrees phase shift with respect to the first clock signal;

applying outputs of the N registers to pixels disposed on the array; and detecting differences between a resulting display pattern and an expected display pattern.

2. The method of claim 1 wherein said expected display pattern comprises expected image data, the method further comprising:

imaging a portion of said first resulting display pattern to generate sensed image data; and comparing said sensed image data to the expected image data to detect differences therebetween.

3. The method of claim 1 further comprising:

coupling a third shorting bar to a first data input terminal;

coupling a fourth shorting bar to a second data input terminals;

applying a first data signal to the third shoring bar; and applying a second data signal to the fourth shorting bar.

4. An apparatus for testing a flat panel display, said flat panel display comprising an active array matrix substrate including a driver integrated circuit formed therein, the apparatus comprising:

a first shorting bar adapted to be coupled to a first plurality of clock input terminals of N successive registers disposed in the driver integrated circuit;

a second shorting bar adapted to be coupled to a second plurality of clock input terminals of the N successive registers; wherein an enabling signal is applied to an enable/disable terminal of a first register, and wherein an output terminal of the (i-1) register is coupled to an enable/disable terminal of the i register, where i is an integer varying from 2 to N;

applying outputs of the N registers to pixels disposed on the array;

means for imaging the resulting display pattern to generate sensed image data; and means for detecting differences between a resulting display pattern and an expected display pattern.

5. The apparatus of claim 4 wherein said expected display pattern comprises expected image data, the apparatus further comprising:

means for imaging a portion of said resulting display pattern to generate sensed image data; and means for comparing said sensed image data to the expected image data to detect differences therebetween.

6. The apparatus of claim 4 further comprising:

a third shorting bar coupled to a first data input terminal and adapted to receive a first data signal; and a fourth shorting bar coupled to a second data input terminal and adapted to receive a second data signal.

* * * * *